United States Patent

Spigarelli et al.

[11] Patent Number: 5,317,803
[45] Date of Patent: Jun. 7, 1994

[54] METHOD OF SOLDERING AN INTEGRATED CIRCUIT

[75] Inventors: Donald J. Spigarelli, Groton, Mass.; John M. DeCarlo, York, Me.; Karl E. Bahr, Hooksett, N.H.

[73] Assignee: Sierra Research and Technology, Inc., Westford, Mass.

[21] Appl. No.: 962,066

[22] Filed: Oct. 16, 1992

Related U.S. Application Data

[63] Continuation of Ser. No. 707,708, May 30, 1991, abandoned.

[51] Int. Cl.⁵ .............................................. H05K 3/30
[52] U.S. Cl. ........................................ 29/840; 29/743; 228/180.1; 228/212
[58] Field of Search ................. 29/760, 764, 743, 740, 29/840, 827; 228/44.3, 44.7, 55, 264, 212, 180.1; 219/121.63, 121.64

[56] References Cited

U.S. PATENT DOCUMENTS

| | | | |
|---|---|---|---|
| 3,914,850 | 10/1975 | Coucoulas | 228/212 X |
| 4,103,814 | 8/1978 | Nishioka | 228/6 A |
| 4,116,376 | 9/1978 | Delorme et al. | 228/170 |
| 4,174,847 | 11/1979 | Wiesler | 279/1 L |
| 4,255,077 | 3/1981 | Smith | 414/786 |
| 4,295,596 | 10/1981 | Doten et al. | 228/264 |
| 4,300,715 | 11/1981 | Keizer et al. | 228/180.1 |
| 4,422,568 | 12/1983 | Elles et al. | 228/111 |
| 4,426,571 | 1/1984 | Beck | 219/373 |
| 4,448,406 | 5/1984 | Hallberg et al. | 269/224 |
| 4,528,746 | 7/1985 | Yoshimura | 29/743 |
| 4,620,659 | 11/1986 | Holdway | 228/20 |
| 4,659,004 | 4/1987 | Fridman | 228/6.2 |
| 4,737,845 | 4/1988 | Susuki et al. | 358/101 |
| 4,832,250 | 5/1989 | Spigarelli et al. | 228/102 |
| 4,914,513 | 4/1990 | Spigarelli et al. | 358/101 |
| 5,021,630 | 6/1991 | Benko et al. | 219/121.64 |

FOREIGN PATENT DOCUMENTS

0276298 11/1990 Japan ................................... 29/743

OTHER PUBLICATIONS

IBM Tech Dis. Bulletin; vol. 11, No. 3; Aug. 1968; Ryan et al.; p. 311.

Primary Examiner—Carl E. Hall
Attorney, Agent, or Firm—Weingarten, Schurgin, Gagnebin & Hayes

[57] ABSTRACT

An integrated circuit device support tool which includes a device for providing a vacuum for holding an integrated circuit device to be soldered to a printed circuit board. The tool also includes a plurality of thin, pressure transferring members for pressing the leads of the integrated circuit device against a printed circuit board during soldering. The pressure transferring members are of a thin material so as not to provide a heat sink during the soldering operation.

9 Claims, 4 Drawing Sheets

METHOD OF SOLDERING AN INTEGRATED CIRCUIT

This application is a continuation of application Ser. No. 07/707,708, filed May 30, 1991, now abandoned.

FIELD OF THE INVENTION

The invention relates to the field of tools for holding integrated circuit devices on printed circuit boards during soldering.

BACKGROUND OF THE INVENTION

The mechanized placement of integrated circuit devices on printed circuit boards for soldering has resulted in a decrease in the labor costs associated with assembling electronic devices. The placement of integrated circuit devices has typically involved what are generically referred to as "pick and place" methods. In these methods a tool is positioned over the integrated circuit device to be placed on the printed circuit board and "picked up". The tool then "places" the integrated circuit device at the correct position on the printed circuit. The integrated circuit device is then soldered in position. The pick and place tool typically relies upon the strength of the leads of the integrated circuit device to provide the proper contact between the integrated circuit device leads and the printed circuit board. This is, the pick and place tool, which is holding the body of the integrated circuit device lowers the integrated circuit device until the leads are pressed against the printed circuit board. The resilience of the leads causes the leads to make a good contact with the printed circuit board during soldering.

With the advent of thin or fragile lead integrated circuit devices, which have less resilience in their leads, the usual pick and place tools do not produce the proper contact between the integrated circuit device leads and the printed circuit board. Instead, the soldering devices themselves have been used to assure the proper contact during the soldering operation. Such devices are typically only used once and fabricate.

The present invention relates to a novel integrated circuit device support tool which provides the proper amount of contact between the fragile leads of an integrated circuit device and the printed circuit board, while permitting the device to be soldered using non-contact radiative or convective techniques.

SUMMARY OF THE INVENTION

The invention relates to an integrated circuit device support tool which includes a device for providing a vacuum for holding an integrated circuit device to be soldered to a printed circuit board. The tool also includes a plurality of thin force transfer members for pressing the leads of the integrated circuit device against the printed circuit board during soldering. The force transfer members are of a thin material so as not to provide a heat sink during the soldering operation. In one embodiment, a bellows is used to provide the vacuum and each force transfer member extends parallel to each respective edge of the integrated circuit device so as to apply pressure to each lead of the integrated circuit device individually. In another embodiment, each force transfer member extends perpendicularly to each respective edge of the integrated circuit device and applies pressure to a keeper bar attached perpendicularly to the ends of the leads. In a third embodiment, the integrated circuit device retaining means engages the body of the integrated circuit device directly without the use of a bellows. In a fourth embodiment a spring is positioned coaxially around the bellows to prevent complete contraction of the bellows when a vacuum is applied, thereby preventing the leads of the integrated circuit device from making contact with the force transfer members prior to the integrated circuit device making of contact with the printed circuit board.

BRIEF DESCRIPTION OF THE DRAWINGS

Other features and benefits of the invention can be more clearly understood with reference to the specification and the accompanying drawings in which.

DESCRIPTION OF THE PREFERRED EMBODIMENT

Figure 1:
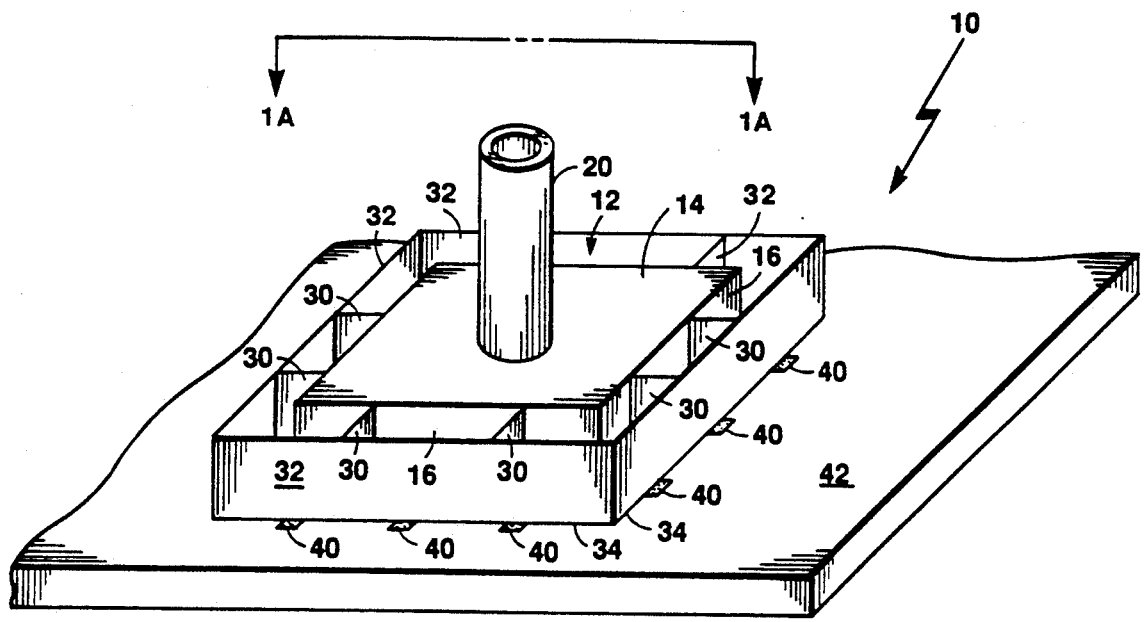
FIG. 1 is a perspective view of an embodiment of the invention.
Figure 1A:
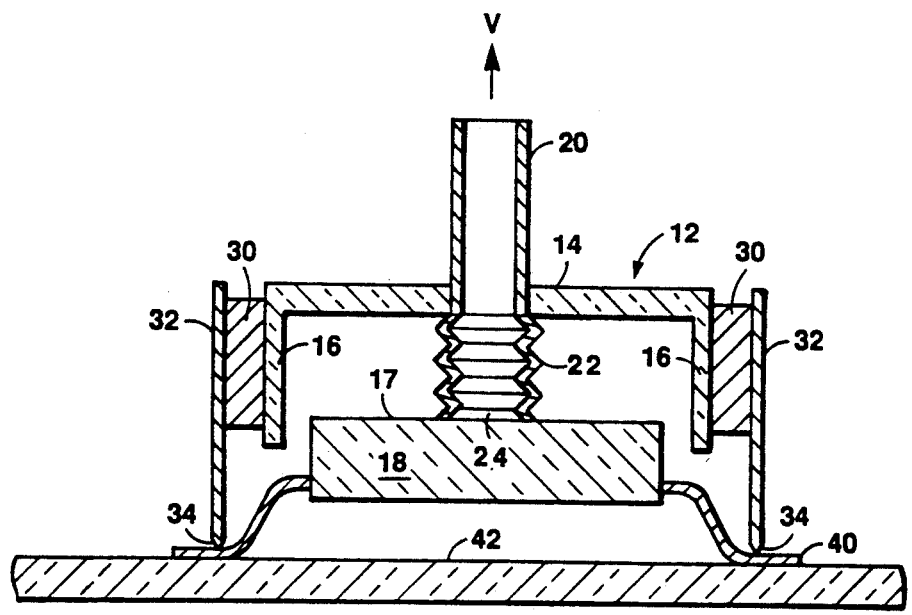
FIG. 1A is a cross-sectional view through section AA' of the embodiment of the invention shown in FIG. 1.

Referring to FIGS. 1 and 1A, an embodiment of the integrated circuit device support tool 10 of the invention includes a containment compartment 12 having a top 14 and four walls 16 defining a cavity sufficiently large to encompass an integrated circuit device 18 to be soldered to a printed circuit board 42. Located approximately in the center of the containment compartment 12 is a hollow vacuum supply tube 20 which provides a vacuum to the containment compartment 12 and which further functions as a support member by way of which the integrated circuit device support tool 10 is rotated and translated horizontally and vertically.

In communication with the hollow vacuum supply tube 20 is a bellows 22. In operation, the open end 24 of the bellows 22 makes contact with the top surface 17 of an integrated circuit chip 18. The application of a vacuum (arrow V) to the hollow vacuum supply tube 20 firmly retains the integrated circuit device 18 against the open end 24 of the bellows 22, causing the bellows 22 to contract and drawing the integrated circuit device 18 into the containment compartment 12. As the support tool 10 is translated, raised and lowered by means attached to the hollow vacuum supply tube 20, the integrated circuit device 18 retained in the containment compartment 12 is also translated, raised and lowered.

A plurality of support members 30, each attached by one end to each respective wall 16 of the containment compartment 12, extend perpendicularly from containment compartment 12. The other end of each support member 30 is attached to a respective force transfer member 32 oriented perpendicularly to the support member 30. One force transfer member 32 is located parallel to each wall 16 of the containment compartment 12. The lower edge 34 of each force transfer member 32 extends below the lower edge of the wall 16 of the containment compartment 12. In operation, as the body of the integrated circuit device 18 is drawn into the containment compartment 12 by the contraction of the bellows 22, the fragile leads 40 on each side of the integrated circuit device 18 are brought into contact with the lower edge 34 of the respective force transfer member 32. The flexibility of the leads 40 cause all of the leads to come into contact with the lower edge 34 of their respective force transfer member 32.

Once the integrated circuit device 18 is secure within the containment compartment 12 and its leads 40 are positioned firmly against the lower edge 34 of the force transfer members 32, the tool 10 is moved to the proper location on a printed circuit board 42 and lowered until the leads 40 of the integrated circuit device 18 are firmly held between the printed circuit board 42 and the lower edge 34 of the pressure transferring members 32. At this point, the leads 40 may be soldered to the printed circuit board 42 by convective or radiative means. In the embodiment shown, the pressure transferring members 32 are constructed of a strong thin material so as to minimize the heat sinking effect of the force transfer members 32 during soldering.

It should also be stated that the support members 30 may be arranged to project from each corner of the containment compartment 12 such that one support member 30 is at each corner, supporting both the adjacent force transfer members 32.

Figure 2:
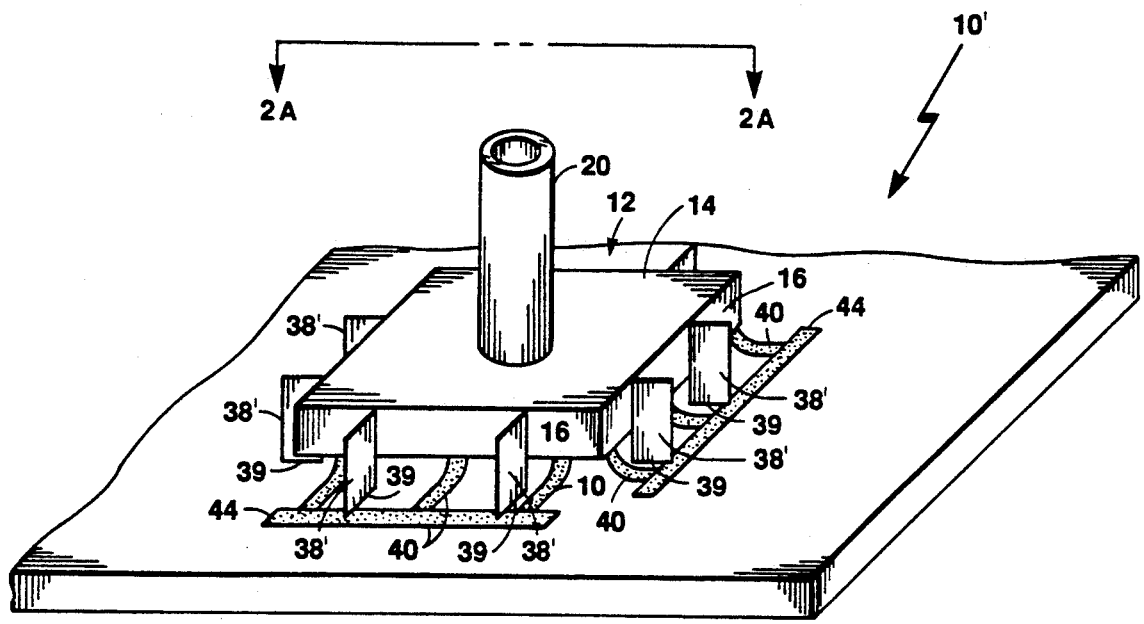
FIG. 2 is a perspective view of another embodiment of the invention.
Figure 2A:
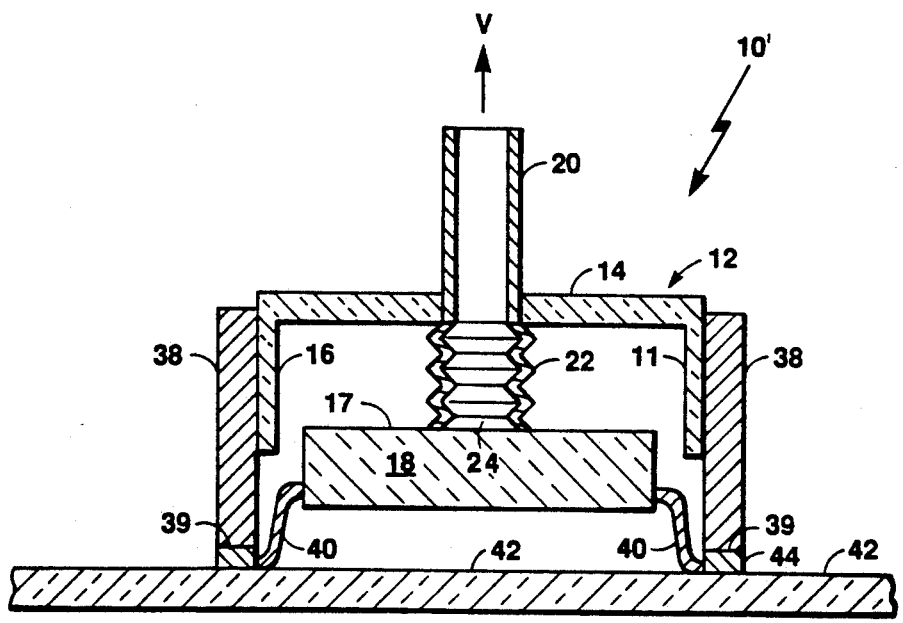
FIG. 2A is a cross-sectional view through section AA' of the embodiment of the invention shown in FIG. 2.

Referring to FIGS. 2 and 2A, another embodiment 10' of the integrated circuit device support tool is depicted for use with integrated circuit devices having a keeper bar 44 extending across all the leads 40 along each respective side of an integrated circuit device 18. The invention again includes a containment compartment 12 defining a cavity sufficiently large to hold the integrated circuit device 18 to be soldered to a printed circuit board. A hollow vacuum supply tube 20 again provides a vacuum to the containment compartment 12 and also functions as a support member by way of which the support tool 10' is rotated and translated horizontally and vertically. A bellows 22 is in communication with the hollow vacuum supply tube 20 and in operation makes contact with the top surface 17 of the integrated circuit chip 18 as described previously.

A plurality of force transfer members 38 extend perpendicularly from containment compartment 12. Although one end of each force transfer members 38 is perpendicularly attached to its respective wall 16 of the containment compartment 12, unlike the support member 30 in the previous embodiment, the other end of each force transfer member 38 is free. The lower edge 39 of each force transfer member 38 extends below the lower edge of the respective wall 16 of the containment 12 and projects sufficiently away from the wall 16 to engage a keeper bar 44 which extends across the leads 40 along each side of the integrated circuit device 18. Therefore, in operation, as the body of the integrated circuit device 18 is drawn into the containment compartment 12 by the contraction of the bellows 22, the keeper bar 44, affixed to the ends of the leads 40 along each side of the integrated circuit device 18, is brought into contact with the lower edge 39 of each respective force transfer member 38. The flexibility of the leads 40 cause them all to bend until the keeper bar 40 makes contact with each force transfer member 38 on its respective side of the integrated circuit device 18.

Once the integrated circuit device 18 is secure within the containment compartment 12 and its keeper bars 44 are positioned firmly against the lower edges 39 of the force transfer members 38, the support tool 10 is moved to the proper location on a printed circuit board 42 and lowered until the keeper bar 44 and its associated leads 40 are firmly held between the printed circuit board 42 and the lower edge 39 of the pressure transferring members 38. At this point, the leads 40 may be soldered to the printed circuit board 42 by convective or radiative means. In the embodiment shown, the force transfer members 38 are again constructed of a strong thin material so as to minimize the heat sinking effect of the force transfer members 38 during soldering.

Figure 3:
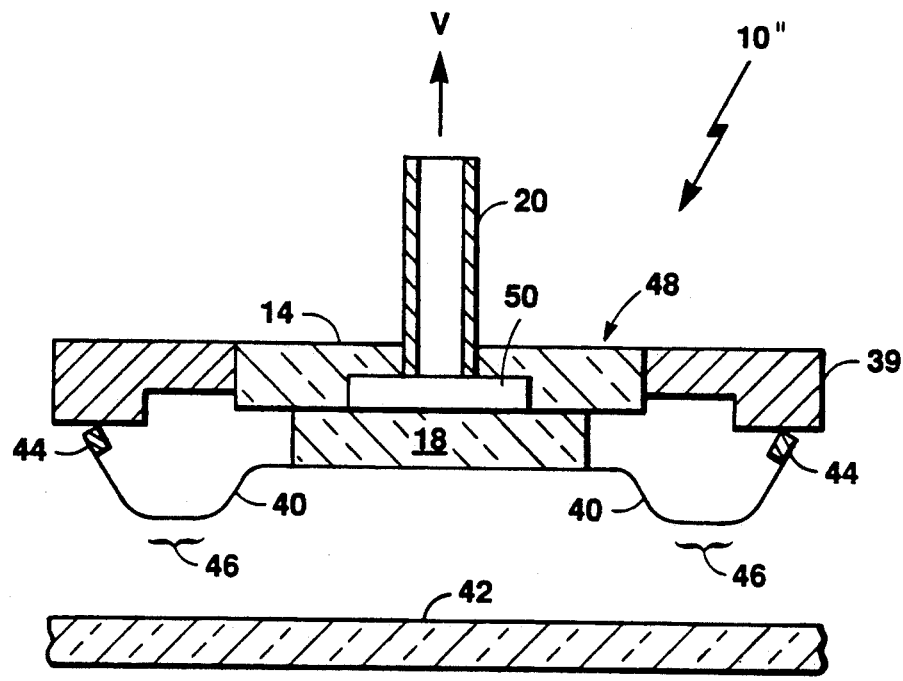
FIG. 3 is a cross-sectional view of another embodiment of the invention.

Yet another embodiment 10'' of the invention is depicted in FIG. 3. This embodiment is for use with an integrated circuit device 18 having a keeper bar 44 at the ends of leads 40 which include a curved region 46. With this type of lead 40, a containment compartment 12 as described previously is not required to hold the body of the integrated circuit device 18. In this embodiment, a hollow vacuum tube 20 is positioned approximately in the center of the top surface 14 of a retaining plate 50 opposite a vacuum cavity 50. The integrated circuit device 18 is held in position against the retaining plate 50 by the vacuum produced in the vacuum cavity 50. Force transfer members 38 again project from and below the retaining plate 48 so as to make contact with the keeper bar 44. When the support tool 10'' is lowered, the curved region 46 of the leads 40 make contact with the printed circuit board 42 and are firmly held against the printed circuit board 42 by the combined restraining forces applied by the retaining plate 48 against the body of the integrated circuit device 18 and by the force transfer member 38 against the keeper bar 44.

Figure 4:
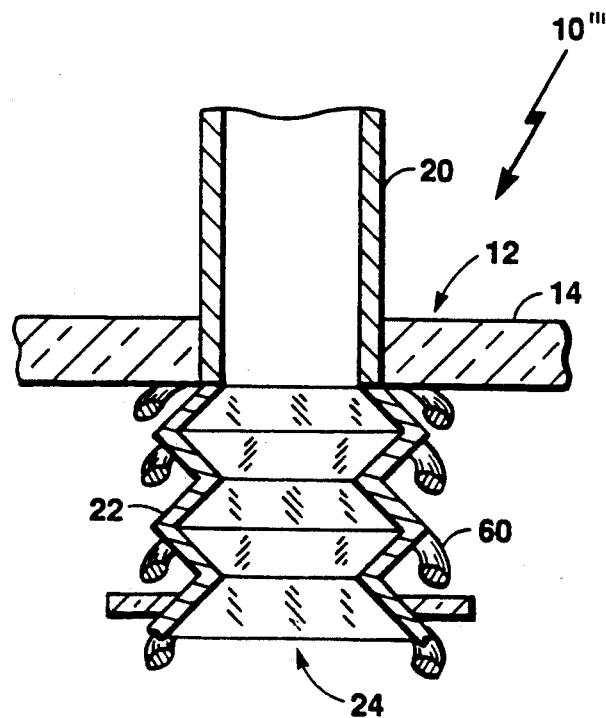
FIG. 4 is an expanded view of the bellows portion of another embodiment of the invention.

In yet another embodiment, a tool 10''' is configured with the force transfer members 32 or 38 as shown in FIGS. 1 or 2, respectively, as well as the containment compartment 12 and bellows 22 previously described. In this embodiment, shown in detail in FIG. 4, a coil spring 60 is positioned coaxially around the bellows 22, so as to bias the bellows 22 in an extended configuration. By the appropriate choice of spring tension, the leads 40 or the keeper bars 44 of the integrated circuit device 18 can be prevented from coming into contact with the force transfer members 32 or 38, respectively, when a vacuum is applied and the integrated circuit device 18 is drawn, by the compression of the bellows 22, into the containment compartment 12. The coil spring 60 exerts enough force to prevent the bellows 22 from compressing beyond a predetermined length, thereby preventing contact with the force transfer members 32 or 38, by the leads 40 or keeper bars 44, respectively. Once the integrated circuit device 18 is in position on the printed circuit board 42, the tool 10''' exerts an additional force in the direction of the printed circuit board 42, thereby further compressing the spring 60 and bringing the leads 40 or the keeper bars 44 into contact with the force transfer members 32 or 38, respectively.

Figure 5:
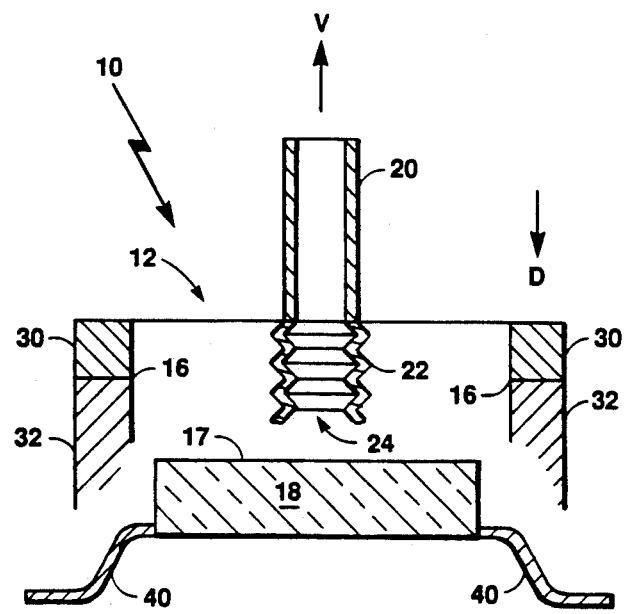
FIGS. 5-5B are a representation of the device in operation.
Figure 5A:
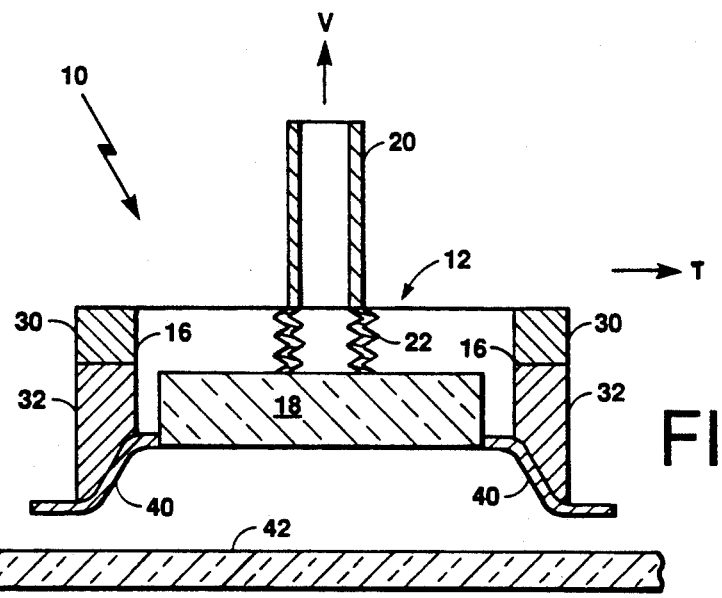
Figure 5B:
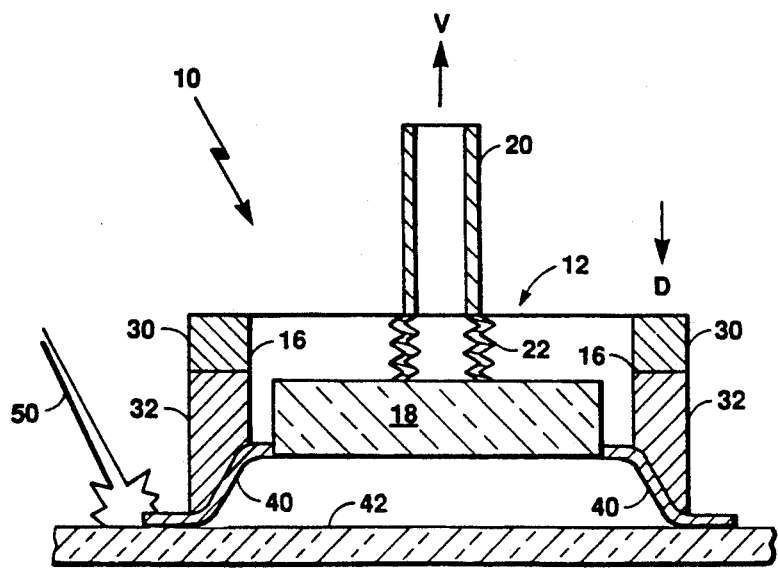

FIGS. 5-5B depict the series of steps in the operation of the support tool 10 shown in FIG. 1. In FIG. 5 the support tool 10 is positioned over an integrated circuit device 18 to be soldered. The support tool is lowered (arrow D) and a vacuum applied (arrow V).

In FIG. 5A the integrated circuit device 18 is drawn, by the collapse of the bellows 22, into the containment compartment 12. This causes the leads 40 to be drawn against force transfer members 32. At this point the support tool 10 and integrated circuit device 18 may be translated (arrow T) and/or rotated to the proper location on the printed circuit board 42.

Once in the proper location, FIG. 5B, the support tool 10 is lowered (arrow D) until the leads 40 of the integrated circuit device 18 are firmly held between the force transfer member 32 and the printed circuit board 42, thereby ensuring good contact. The leads 40 may then be soldered using a radiative beam 50 or convection techniques. Once all the leads 40 of the integrated circuit device 18 have been soldered, the vacuum is released and the support tool 10 lifted from the integrated circuit device 18.

These and other examples of the concept of the invention illustrated above are intended by way of example and the actual scope of the invention is to be determined solely from the following claims.

What is claimed is:

1. A method of soldering an integrated circuit having a plurality of leads to a printed circuit board comprising the steps of:
   holding said integrated circuit by an integrated circuit support tool with a vacuum force, said integrated circuit support tool comprising a retaining portion and a thin force transfer member having a low heat-sinking capacity;
   applying a force to preselected leads of said integrated circuit device with said thin force transfer member thereby pressing said preselected leads against said printed circuit board when said integrated circuit device is in position for soldering; and
   applying sufficient heat from an external heat source to solder said preselected leads to said printed circuit board.

2. The method of claim 1 wherein said step of holding said integrated circuit by said integrated circuit support tool further comprises the steps of:
   positioning said integrated circuit support tool over said integrated circuit device; and
   picking up said integrated circuit device with said integrated circuit support tool.

3. The method of claim 1 wherein following the step of applying sufficient heat from said external heat source to solder said preselected leads to said printed circuit board, said method further comprises the step of releasing said integrated circuit device from said integrated circuit support tool.

4. A method of soldering an integrated circuit device having a body and a plurality of leads to a printed circuit board comprising the steps of:
   placing an integrated circuit support tool, adapted to hold said integrated circuit device, against said integrated circuit device, said integrated circuit support tool comprising:
   a containment compartment having four walls and a top surface defining a cavity for holding said body of said integrated circuit device;
   a bellows, positioned within said cavity and extending from said top surface, said bellows in communication with a vacuum supply tube extending from said top surface of and external to said containment compartment; and
   a force transfer device comprising:
   a plurality of support members each having a first end and a second end, said first end of each support member attached to a respective wall of said containment compartment, each said support member extending from said wall of said containment compartment; and
   four force transfer members, each oriented parallel with one respective wall of said containment compartment and attached to said second end of said respective support member associated with said respective wall of said containment compartment, and each said force transfer member oriented so as to make contact with and apply a force to preselected ones of said leads of said integrated circuit device when said integrated circuit device is retained within said containment compartment;
   applying a vacuum to said vacuum supply tube to create a vacuum in said bellows to draw said integrated circuit device into said containment compartment, thereby bringing said four force transfer members against said plurality of leads;
   pressing said preselected leads against said printed circuit board, when said integrated circuit device is in position for soldering, with said force transfer member; and
   applying sufficient heat from an external heat source to solder said preselected leads to said printed circuit board.

5. The method of claim 4, further comprising a preliminary step of positioning said integrated circuit support tool over said integrated circuit device prior to said step of placing said integrated circuit support tool against said integrated circuit device.

6. The method of claim 4 further comprising the steps of:
   releasing said vacuum applied to said vacuum supply tube to cause said integrated circuit device to be released from said containment compartment; and
   lifting said integrated circuit support tool from said integrated circuit device,
   subsequent to the step of applying sufficient heat from said external heat source to solder said preselected leads to said printed circuit board.

7. A method of soldering an integrated circuit device having a body and a plurality of leads, preselected ones of said leads connected by one of a plurality of keeper bars, to a printed circuit board, said method comprising the steps of:
   placing an integrated circuit support tool, adapted to hold said integrated circuit device, against said integrated circuit device, said integrated circuit support tool comprising:
   a containment compartment having four walls and a top surface defining a cavity for holding the body of said integrated circuit device;
   a bellows, positioned within said cavity and extending from said top surface, said bellows in communication with a vacuum supply tube extending from an external to said top surface of said containment compartment; and
   a force transfer device comprising a plurality of thin force transfer members each having a first end and a second end and each having a lower heat-sinking capacity, said first end of each force transfer member attached to a respective wall of said containment compartment, each said force transfer member extending from said wall of said containment compartment, each said force transfer member oriented so as to make contact with and apply a force to a selected one of said keeper bars when said integrated circuit device is retained within said containment compartment;

applying a vacuum to said vacuum supply tube to create a vacuum in said bellows to draw said integrated circuit device into said containment compartment, thereby bringing said four force transfer members against said plurality of leads;

pressing said preselected leads against said printed circuit board when said integrated circuit device is in position for soldering with said force transfer member; and applying sufficient heat from an external heat source to solder said preselected leads to said printed circuit board.

8. The method of claim 7, further comprising a preliminary step of positioning said integrated circuit support tool over said integrated circuit device prior to said step of placing said integrated circuit support tool against said integrated circuit device.

9. The method of claim 7, further comprising the steps of:

releasing said vacuum applied to said vacuum supply tube to cause said integrated circuit device to be released from said containment compartment; and lifting said integrated circuit support tool from said integrated circuit device, subsequent to the step of applying sufficient heat from said external heat source to solder said preselected leads to said printed circuit board.

* * * * *

UNITED STATES PATENT AND TRADEMARK OFFICE
CERTIFICATE OF CORRECTION

PATENT NO. : 5,317,803

DATED : June 7, 1994

INVENTOR(S) : Donald J. Spigarelli, et al.

It is certified that error appears in the above-indentified patent and that said Letters Patent is hereby corrected as shown below:

```
Column 1, line 42, "used once and fabricate" should read
--used once and are additionally expensive to fabricate--.
```

Signed and Sealed this

Third Day of January, 1995

*Attest:*

BRUCE LEHMAN

*Attesting Officer*         Commissioner of Patents and Trademarks